(12) United States Patent
Fayneh et al.

(10) Patent No.: US 6,661,213 B2
(45) Date of Patent: *Dec. 9, 2003

(54) ON-CHIP FILTER-REGULATOR, SUCH AS ONE FOR A MICROPROCESSOR PHASE LOCKED LOOP (PLL) SUPPLY

(75) Inventors: Eyal Fayneh, Givatayim (IL); Ernest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/916,926

(22) Filed: Jul. 27, 2001

(65) Prior Publication Data

US 2002/0030471 A1 Mar. 14, 2002

Related U.S. Application Data

(62) Division of application No. 09/661,138, filed on Sep. 13, 2000, now Pat. No. 6,313,615.

(51) Int. Cl.$^7$ .................................................. G05F 1/56
(52) U.S. Cl. ....................................... 323/280; 323/281
(58) Field of Search ................................. 323/273, 280, 323/281, 303, 313, 314

(56) References Cited

U.S. PATENT DOCUMENTS

| 4,525,663 | A | | 6/1985 | Henry |
| 5,334,928 | A | | 8/1994 | Dobkin et al. |
| 5,625,278 | A | | 4/1997 | Thiel et al. |
| 5,787,014 | A | * | 7/1998 | Hall et al. ................... 323/313 |
| 5,847,552 | A | * | 12/1998 | Brown ......................... 323/281 |
| 6,046,577 | A | | 4/2000 | Rincon-Mora et al. |
| 6,114,843 | A | | 9/2000 | Olah |
| 6,175,224 | B1 | | 1/2001 | Kadanka |
| 6,313,615 | B1 | * | 11/2001 | Fayneh et al. ............... 323/281 |
| 6,446,212 | B1 | * | 9/2002 | Smit et al. ................... 323/275 |

* cited by examiner

*Primary Examiner*—Jeffrey Sterrett
(74) *Attorney, Agent, or Firm*—Blakely, Sokoloff, Taylor & Zafman LLP

(57) ABSTRACT

An on-chip, e.g., on a microprocessor, super filter-regulator acts as a voltage regulator and a low-pass filter. The voltage regulator generates a constant DC output voltage and regulates the DC voltage against instantaneous load changes. The low-pass filter and actively filters AC interference out of the DC output voltage. The super filter-regulator provides the filtered and regulated DC voltage to a phase locked loop circuit.

26 Claims, 3 Drawing Sheets

ON-CHIP FILTER-REGULATOR, SUCH AS ONE FOR A MICROPROCESSOR PHASE LOCKED LOOP (PLL) SUPPLY

This application is a divisional of U.S. patent application Ser. No. 09/661,138 filed Sep. 13, 2000 (now U.S. Pat. No. 6,313,615 issued Nov. 6, 2001).

BACKGROUND OF THE INVENTION

1. Field of the Invention

The invention is related to integrated circuits and integrated circuit technology, and in particular, to integrated circuit low noise/analog power supplies.

2. Background Information

One limitation of the circuit 100 is poor frequency performance by the LC filter 106, and as a result, for the circuit 100 overall. This is because the inductor 108 has parasitic capacitance and the capacitor 110 has parasitic inductance. FIG. 2 is a graphical representation a response curve 200 for the LC filter 106, which shows a pole 201 at fifteen kilohertz (kHz), where the gain of the circuit 100 is reduced by approximately 3 dB. This means that at fifteen kHz the gain of the circuit 100 is half of what the gain is at zero hertz.

FIG. 1 shows a block diagram of a typical circuit 100 used to filter a microprocessor core voltage supply 102 and generate an analog voltage supply 104. The circuit 100 includes an inductor-capacitor (LC) filter 106, which is a low pass filter. This means that the LC filter 106 when operating as desired, allows low frequencies to pass through it and attenuates high frequencies. The LC filter 106 includes an inductor 108 and a capacitor 110. The analog voltage supply 104 is coupled to a phase locked loop (PLL) circuit 112. The PLL circuit 112 is located on a microprocessor 120. The return path for the analog voltage supply 104 is a return path 114.

One limitation of the circuit 100 is poor frequency performance by the LC filter 106, and as a result, for the circuit 100 overall. This is because the inductor 108 has parasitic capacitance and the capacitor 110 has parasitic inductance. FIG. 2 is a graphical representation a response curve 200 for the LC filter 106, which shows a pole at fifteen kilohertz (kHz), where the gain of the circuit 100 is reduced by approximately 3 dB. This means that at fifteen kHz the gain of the circuit 100 is half of what the gain is at zero hertz.

Also shown in FIG. 2 is a notch 202 at one megahertz (MHz). At frequencies higher than one MHz, the gain of the circuit 100 increases significantly, which is the opposite of the desired frequency performance.

The response curve 200 also shows a reflection portion 204. The reflection portion 204 indicates that at frequencies higher than or equal to one MHz the LC filter 106 begins to pass high frequencies, which is undesirable.

FIG. 2 also shows another limitation of the circuit 100, which is the noise amplification at Fpeak 206 (or peak frequency) due to the second order nature of the LC filter 106. The noise amplification may degrade the phase noise performance of the PLL circuit 112.

A further limitation of the circuit 100 is that when the core voltage supply 102 changes the analog voltage supply 104 to the PLL circuit 112 changes accordingly. For example, operation in wide ranges of variations in the analog voltage supply 104 may degrade the PLL circuit 112's performance. Wide ranges in the analog voltage supply 104 also may cause the PLL circuit 112 to cease operating.

Another limitation is that each phase locked loop circuit has its own inductor-capacitor filter. This means that as the number of phase locked loop circuits increases the number of LC filters, and individual capacitors and inductors, increases.

Moreover, the prior art LC filter 106 is typically located on a computer's motherboard. This can mean a large number of components on each motherboard, depending on the number of PLL circuits 112 in a particular processor.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

A filter-regulator for an integrated circuit phase locked loop supply is described in detail herein. In the following description, numerous specific details are provided, such as particular currents, voltages (or potentials), operational amplifiers, capacitors, transistors, and other components, etc. to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
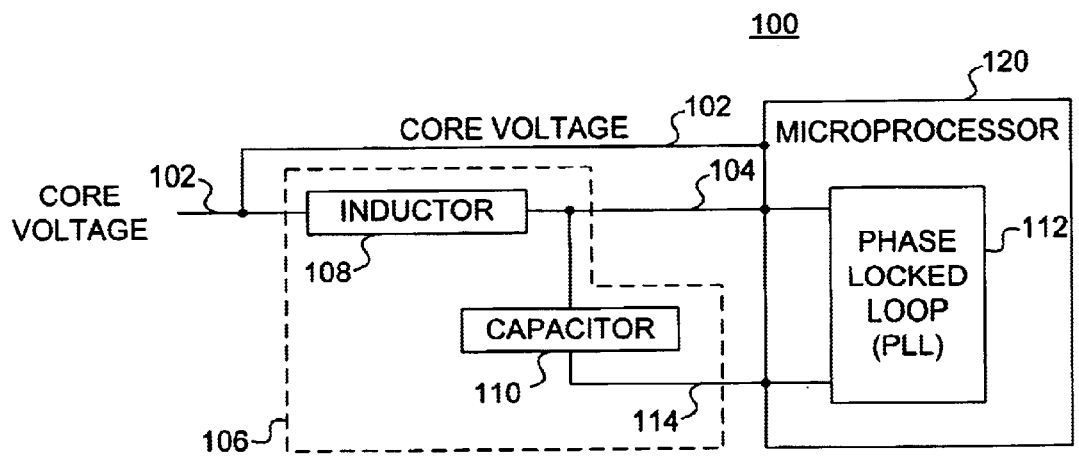
FIG. 1 is a block diagram of a prior art inductor-capacitor filter circuit.
Figure 3:
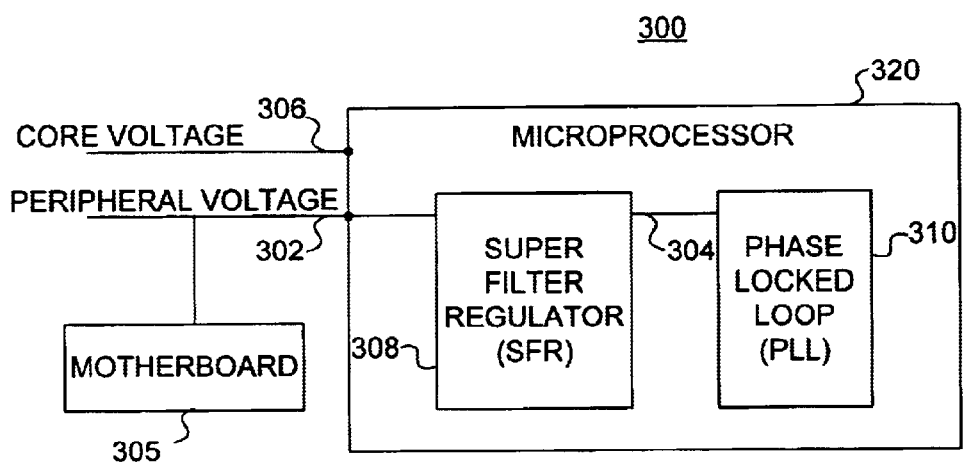
FIG. 3 is a block diagram of a circuit according to an embodiment of the present invention that regulates and filters a phase locked loop voltage.
Figure 2:
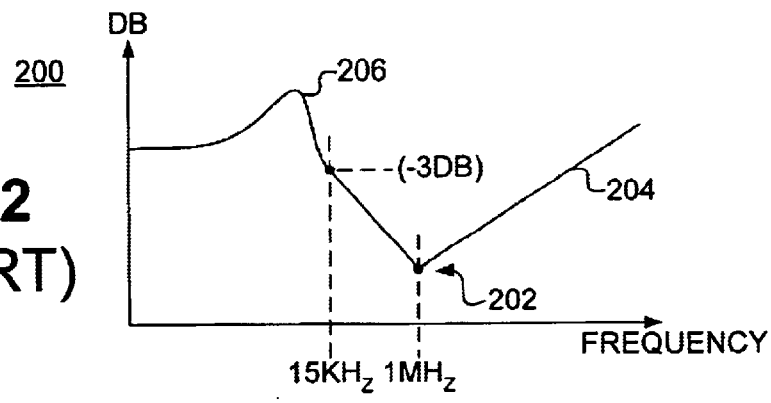
FIG. 2 is a graphical representation of the response curve for the inductor-capacitor filter circuit in FIG. 1.

FIG. 3 shows a block diagram of a circuit 300 according to an embodiment of the present invention that filters and regulates a peripheral voltage supply 302 and generates a PLL analog voltage supply 304. In one embodiment, the peripheral voltage supply 302 is a DC voltage available from the motherboard 305 of a computer. The peripheral voltage supply 302 can have many purposes.

The PLL analog voltage supply 304 is a filtered and regulated peripheral voltage supply 302. Unlike the prior art, however, the PLL analog voltage supply 304 is generated on-chip (or on-die).

The circuit 300 includes a core voltage supply 306 and a super filter-regulator (SFR) 308. In one embodiment, the core voltage supply 306 is the voltage supply for a microprocessor core. In this embodiment, the core voltage supply 306 is typically referred to as Vcc. In other embodiments where the chip is a clock or other circuitry, the core voltage supply 306 is the voltage supply for the chip.

The SFR 308 acts as a low-pass filter and a regulator, and has a regulating portion and a filtering portion. The regulating portion generates a constant DC output voltage and regulates it against instantaneous load changes. In one embodiment, the peripheral voltage supply 302 operates the SFR 308. The filtering portion substantially removes alternating current (AC) interference from the peripheral voltage supply 302, beginning at very low frequencies.

The SFR 308 generates the PLL analog voltage supply 304 and couples it to a phase locked loop (PLL) circuit 310. The PLL circuit 310 can be any well-known phase locked loop circuit and performs its conventional functions of comparing input frequencies and generating an output that is a measure of their phase difference (phase error signal). The phase error signal typically is filtered and amplified. If the two input frequencies are not equal, the phase error signal causes one of the input frequencies to deviate in the direction of the other input frequency. Under the right conditions, the two frequencies will lock, maintaining a fixed phase relationship with each other.

According to an embodiment, the SFR 308 and the PLL circuit 310 are located on-chip, e.g., on a microprocessor, such as a microprocessor 320. In this embodiment, the core voltage supply 306 is the voltage supply for the microprocessor 320 core.

The microprocessor 320 can be a processor of the Pentium® family available from Intel Corporation of Santa Clara, Calif. The microprocessor 320 performs its conventional functions of executing programming instructions, including implementing many of the teachings of the present invention.

Although the embodiment shown in FIG. 3 depicts the microprocessor 320, the on-chip SFR 308 can be located on any suitable chip, die, integrated circuit, etc. Suitable chips include clock circuits and other chip sets that use phase locked loop circuits or need an analog voltage supply for special circuits. From the description provided herein, persons of ordinary skill in the relevant arts will be able to implement these other embodiments.

Figure 4:
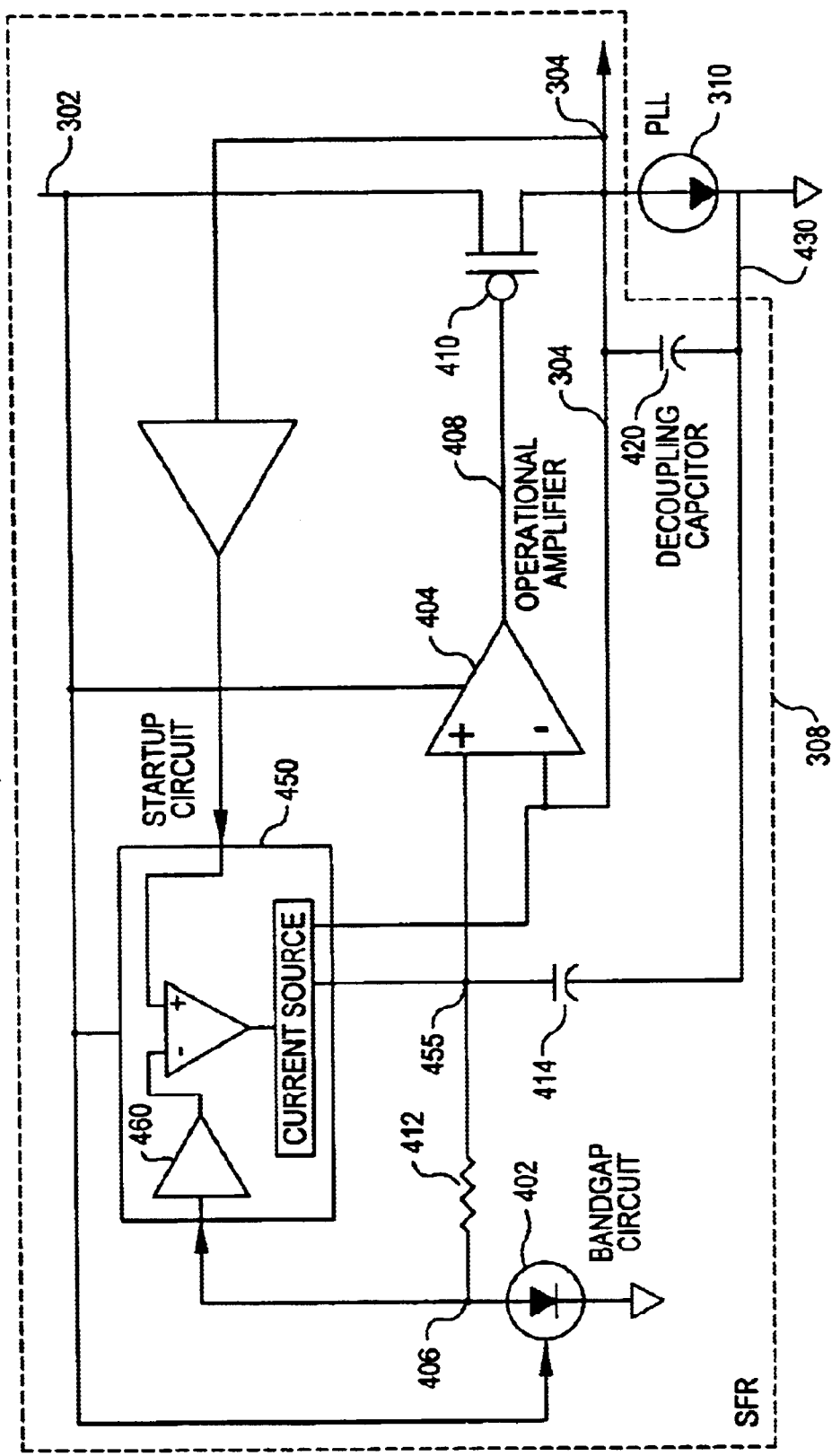
FIG. 4 is a schematic diagram of the filter-regulator depicted in FIG. 3.

FIG. 4 is a schematic diagram of circuit 400 according to one embodiment of the present invention. The circuit 400 includes the SFR 308 and the PLL circuit 310. The SFR 308 includes a bandgap reference circuit 402 and an operational amplifier 404.

The bandgap reference circuit 402 is diode-based and provides a very high accuracy voltage source that is independent of chip voltage supply variations, temperatures, and process changes. Bandgap reference circuits suitable for implementing the bandgap reference circuit 402 are well known.

The operational amplifier 404 is a broadband operational amplifier, which actively filters out AC fluctuations in the PLL analog voltage supply 304. The bandwidth of the operational amplifier 404 determines part of the frequency response of the SFR 308. Load changes (or changes in the PLL analog voltage supply 304) at frequencies inside the operational amplifier 404's bandwidth are compensated for by a change in the operational amplifier 404's output voltage (408).

The bandgap reference circuit 402 generates a reference voltage (bandgap voltage) 406. One suitable bandgap reference circuit 402 generates a 1.2 volt reference voltage.

The SFR 308 includes a serial transistor 410. The serial transistor 410's output is the PLL analog voltage supply 304 and the serial transistor 410 drives the PLL circuit 310. The serial transistor 410's input is coupled to the operational amplifier 404's output voltage 408. When AC changes occur in the peripheral voltage supply 302, they are drastically attenuated by the negative feedback provided by the PLL analog voltage supply 304 being coupled to the inverting input (negative supply terminal) of the operational amplifier 404.

One embodiment of the circuit 400 operates as follows. The bandgap voltage 406 is present on the noninverting input (positive supply terminal) of the operational amplifier 404. The operational amplifier 404 regulates the PLL analog voltage supply 304, which is coupled to the operational amplifier 404's inverting input (negative supply terminal). The operational amplifier 404's differential voltage is close to zero and the PLL analog voltage supply 304 is equal to the bandgap voltage 406. The bandgap voltage 406 is actively maintained on the operational amplifier 404's noninverting input (positive supply terminal).

When the operational amplifier 404's output voltage 408 goes high, the output of the serial transistor 410, which is the PLL analog voltage supply 304, goes low, and vice versa. When the bandgap reference circuit 402 is ideal there is zero fluctuation in the bandgap voltage 406. The result is that the operational amplifier 404 compensates for each fluctuation in the peripheral voltage supply 302 because the bandgap voltage 406 remains constant. However, the bandgap reference circuit 402 is not ideal and the bandgap voltage 406 fluctuates as the peripheral voltage supply 302 fluctuates.

Figure 5:
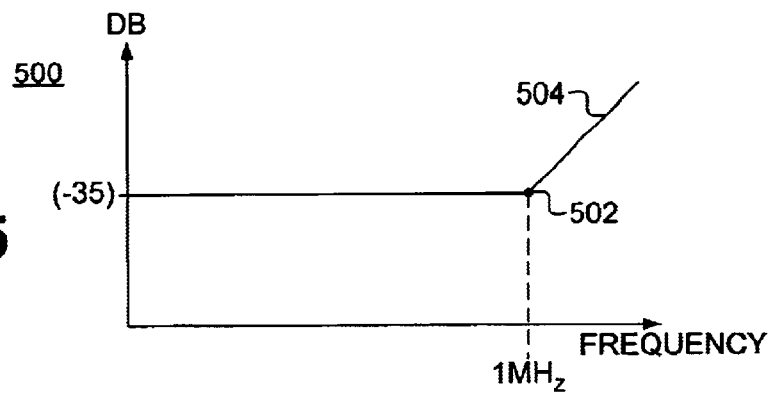
FIG. 5 is a graphical representation of a frequency response curve for the bandgap circuit.

FIG. 5 is a graphical representation of a frequency response curve 500 for the bandgap reference circuit 402 as described so far herein. The response curve 500 shows that there is a pole 502 at about one MHz where the gain of the circuit increases significantly, which is the opposite of the desired frequency performance. A reflection portion 504 of the response curve 500 indicates that the bandgap reference circuit 402 begins to pass frequencies higher than one MHz, which is undesirable because AC fluctuations (or interference) in the peripheral voltage supply 302 higher than one MHz will change the bandgap voltage 406. Of course, pole location is implementation specific, and from the description herein, persons of ordinary skill in the relevant arts could generate poles for various frequencies.

To filter out AC fluctuations (or interference) higher than one MHz from the bandgap voltage 406, one embodiment of the SFR 308 includes a resistance 412 and a super filter capacitor 414. The resistance 412 can be an n-well resistance.

The addition of the resistance 412 and the super filter capacitor 414 places a pole at one hundred KHz to aid in filtering the bandgap voltage 406. The resistance 412 and the super filter capacitor 414 allow a filtered bandgap voltage 406 to pass to the noninverting input (positive supply terminal) of the operational amplifier 404 as a reference voltage 455.

Figure 6:
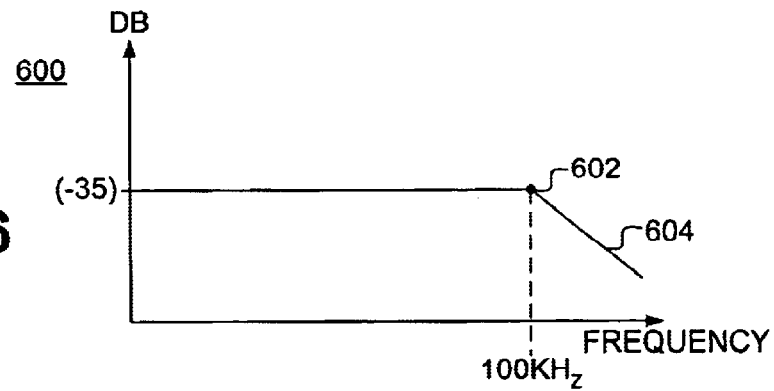
FIG. 6 is a graphical representation of a response curve for the super filter-regulator depicted in FIG. 4.

FIG. 6 is a graphical representation of the response curve 600 for the reference voltage 455 taking into consideration the effects of the resistance 412 and the super filter capacitor 414. The response curve 600 shows a pole 602 at about 100 KHz. However, with the resistance 412 and the super filter capacitor 414, the reference voltage 455 is stable across a wide range of frequencies to a level of −35 dB with respect to the peripheral voltage supply 302. When the reference voltage 455 is stable across a wide range of frequencies, the regulated PLL analog voltage supply 304 also is stable across a wide range of frequencies. The pole 602 at one hundred KHz is determined by 1/RC, where R is the value of the resistance 412 and C is the value of the super filter capacitor 414.

In another embodiment, the SFR 308 includes a decoupling capacitor 420, which compensates for load changes at frequencies outside the operational amplifier 404's bandwidth. The decoupling capacitor 420 shunts all fluctuations higher than the operational amplifier 404's bandwidth to a return path 430 for the PLL analog voltage supply 304. The decoupling capacitor 420 does this by providing a pole. The decoupling capacitor 420 thus filters interference from the PLL analog voltage supply 304 at frequencies associated with the decoupling capacitor 420. In an embodiment where response of the SFR 308 without the decoupling capacitor 420 is about 100 MHz, the decoupling capacitor 420 provides a pole at around 100 MHz.

The SFR 308 also includes a startup circuit 450, which is used to initialize the circuit 400. The initialization of the circuit 400 allows for a fast building of the voltage on the noninverting input (positive supply terminal) of the operation amplifier 404. The bandgap reference circuit 402 may not be able to build the voltage on the noninverting input (positive supply terminal) of the operation amplifier 404 because the bandgap reference circuit 402 may not be able to drive such a load. Alternatively, it may take a long time for the bandgap reference circuit 402 to build the voltage on the noninverting input (positive supply terminal) of the operational amplifier 404. The startup circuit 450 charges up the node (reference voltage 455) between the noninverting input (positive supply terminal) of the operation amplifier 404 and the resistance 412 and then turns off.

The startup circuit 450 is a comparator-based circuit, with a buffer 460 on the input to protect the bandgap reference circuit 402 from loading. The start up circuit 450 compares the bandgap voltage 406 to the PLL analog voltage supply 304.

The startup circuit 450 also has a current source 462 that drives the node (at 455) between the noninverting input (positive supply terminal) of the operation amplifier 404 and the resistance 412 to charge it up. When the potential of the PLL analog voltage supply 304 is equivalent to the potential of the bandgap voltage 406, the startup circuit 450 switches off.

It is sometimes desirable to run microprocessor cores at a very high frequency or a very low frequency. To do this, the microprocessor core voltage supply is increased accordingly. If the associated phase locked loop circuit is not designed to respond to a very wide range of core voltage supplies, the phase locked loop circuit may fail. One feature of the present invention makes phase locked loop circuits more robust. For example, aspects of the present invention reduce the risk of phase locked loop failures by maintaining a constant, regulated, and filtered voltage regardless of the increases in the microprocessor core voltage supply. Therefore, mobile personal computers, which tend to use very low power, benefit as well as high performance desktop computers.

The SFR 308 also reduces motherboard 305 bill of materials, which reduces costs. For example, using the prior art circuit 100 there is an inductor-capacitor circuit for each phase locked loop circuit, usually located on the motherboard 305. According to aspects of the present invention, there is no need for individual inductor-capacitor circuits because the SFR 308 can supply more than one phase locked loop circuit. Additionally, there is better yield because there may be fewer failures on the motherboard 305 with no LC filter.

To ensure proper operation, many phase locked loop circuits are required to be extensively checked for different voltages that could be present at various points in the phase locked loop circuit. Using the SFR 308 the phase locked loop circuits need only be checked in one location. That is, to determine proper operation, only the PLL analog voltage supply 304 need be checked.

Most phase locked loop circuits have inherent noise. Using the SFR 308 there is improved phase locked loop phase noise performance. In one embodiment, there is about 30 dB of PLL analog voltage supply filtering at 0 Hz with respect to the peripheral voltage supply 302.

The SFR 308 reduces the design time for phase locked loop circuits. For example, phase locked loop circuits need only be designed to operate at the PLL analog voltage supply 304 as opposed to many different voltages that a supply voltage may be.

The SFR 308 enables the use of modern power management techniques. For example, when it is desired to change microprocessor core voltage and frequency at the same time, the SFR 308 allows one dimension that does not change. This dimension is the analog supply voltage 304.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system, comprising:
   a power supply to generate a peripheral voltage; and
   a microprocessor coupled to the power supply and to a core voltage supply, the microprocessor having a filter-regulator coupled to generate a direct current (DC) voltage, to regulate the DC voltage against instantaneous changes in loading, to filter interference from the DC voltage, and to generate an output voltage.

2. The system of claim 1 wherein the microprocessor and power supply are formed on the same die.

3. The system of claim 1, further comprising a motherboard wherein the power supply is located on the motherboard.

4. The system of claim 1, wherein the microprocessor includes at least one phase locked loop coupled to the filter-regulator to receive the output voltage.

5. The system of claim 4 wherein the filter-regulator includes:
   bandgap reference circuitry to generate a reference voltage; and
   a filter coupled to the bandgap reference circuitry to generate a reference voltage, to filter alternating current (AC) fluctuations from the reference voltage, and to provide the filtered reference voltage to the phase locked loop.

6. The system of claim 5 wherein the filter has at least one pole to compensate for a pole of the bandgap reference circuitry.

7. The system of claim 5 wherein the filter includes an operational amplifier having a non-inverting input coupled to receive the reference voltage.

8. The system of claim 7 wherein the filter includes a resistor-capacitor circuit coupled to a non-inverting input of the operational amplifier and to the voltage regulator.

9. The system of claim 8 wherein the filter includes a decoupling capacitor coupled to an inverting input of the operational amplifier and to the phase locked loop.

10. The system of claim 8, further comprising a startup circuit coupled to the non-inverting input of the operational amplifier.

11. The system of claim 10, wherein the startup circuit comprises a buffer coupled to the non-inverting input of the operational amplifier.

12. The system of claim 11, wherein the startup circuit comprises a comparator coupled to compare the reference voltage to the output voltage.

13. The system of claim 12, wherein the startup circuit comprises a current source coupled to charge a node between the circuitry to generate a reference voltage and the non-inverting input of the operational amplifier.

14. An apparatus, comprising:
a single integrated circuit microprocessor coupled to receive a core voltage and a peripheral voltage, the microprocessor having:
circuitry to generate a reference voltage;
a phase locked loop;
an operational amplifier coupled to the circuitry to receive the reference voltage on a non-inverting input to generate an output voltage and to the phase locked loop to drive the phase locked loop; and
a resistor-capacitor circuit coupled between the circuitry to generate a reference voltage and the non-inverting input of the operational amplifier to filter alternating current (AC) fluctuations in the reference voltage.

15. The apparatus of claim 14 wherein the resistor-capacitor circuit has at least one pole to compensate for a pole of the circuitry to generate a reference voltage.

16. The apparatus of claim 14, further comprising a transistor coupled to receive the output voltage and to drive the phase locked loop.

17. The apparatus of claim 14 wherein the circuitry to generate a reference voltage includes a bandgap reference circuit.

18. The apparatus of claim 17, further comprising a capacitor coupled to the inverting input of the operational amplifier.

19. The apparatus of claim 17, further comprising circuitry coupled to charge a node between the circuitry to generate a reference voltage and a non-inverting input of the operational amplifier.

20. An apparatus, comprising:
a microprocessor coupled to receive a core voltage and a peripheral voltage, the microprocessor having:
circuitry to generate a reference voltage from the peripheral voltage;
a phase locked loop; and
an operational amplifier coupled to the circuitry to receive the reference voltage on a non-inverting input to generate an output voltage and to the phase locked loop to drive the phase locked loop.

21. The apparatus of claim 20, further comprising a transistor coupled to receive the output voltage and to drive the phase locked loop.

22. The apparatus of claim 20 wherein the circuitry to generate a reference voltage includes a bandgap reference circuit.

23. The apparatus of claim 22, further comprising a resistor-capacitor circuit coupled between the circuitry to generate a reference voltage and a non-inverting input of the operational amplifier to filter alternating current (AC) fluctuations in the reference voltage.

24. The apparatus of claim 23, further comprising a capacitor coupled to the inverting input of the operational amplifier.

25. The apparatus of claim 23, further comprising circuitry coupled to charge a node between the circuitry to generate a reference voltage and a non-inverting input of the operational amplifier.

26. The apparatus of claim 23 wherein the resistor-capacitor circuit has at least one pole to compensate for a pole of the circuitry to generate a reference voltage from a peripheral voltage.

* * * * *

UNITED STATES PATENT AND TRADEMARK OFFICE
CERTIFICATE OF CORRECTION

PATENT NO. : 6,661,213 B2
DATED : December 9, 2003
INVENTOR(S) : Fayneh et al.

It is certified that error appears in the above-identified patent and that said Letters Patent is hereby corrected as shown below:

<u>Column 1,</u>
Line 46, after "higher than", insert -- or equal to --.

Signed and Sealed this

Thirtieth Day of March, 2004

JON W. DUDAS
*Acting Director of the United States Patent and Trademark Office*